United States Patent [19]

Wilcken

[11] Patent Number: 5,506,424
[45] Date of Patent: Apr. 9, 1996

[54] SPHERICAL BEARING OPTICAL MOUNT

[76] Inventor: Steve Wilcken, 3407 Glasgow Ct., Fort Collins, Colo. 80526-2388

[21] Appl. No.: 369,417

[22] Filed: Jan. 6, 1995

[51] Int. Cl.$^6$ ................................................. H01L 27/14
[52] U.S. Cl. .......................... 257/99; 257/98; 359/503; 359/506; 359/813
[58] Field of Search ...................... 257/99, 98; 359/506, 359/503, 813

[56] References Cited

U.S. PATENT DOCUMENTS

| | | | |
|---|---|---|---|
| 4,119,363 | 10/1978 | Camlibel et al. | 257/98 |
| 4,285,572 | 8/1981 | Beaudettet et al. | 257/99 |
| 5,468,262 | 11/1995 | Acker et al. | 44/348 |

*Primary Examiner*—Sara W. Crane
*Assistant Examiner*—Jhihan Clark
*Attorney, Agent, or Firm*—Harry I. Leon; Vivian L. Steadman

[57] ABSTRACT

A mounting device for a laser light source comprising fixed and mobile platforms which are generally cylindrical in shape, the fixed platform being slideably receivable within an optical tube. Each of the platforms has both one closed and one open end, the closed end defining a centrally-located socket for receiving a spherical bearing and at least three holes spaced equidistant from each other. The holes in the fixed platform are alignable with those in the mobile platform. In assembled relation, the spherical bearing is juxtaposed between the two platforms and held in place by three clamping screws. The shank of each of these clamping screws extends through one of the holes in the fixed platform, past the spherical bearing, and threadedly engages a hole in the mobile platform. Adjustment of the boresight, or alignment with a target, of the laser beam is accomplished by tilting the mobile platform so that its longitudinal axis is disposed at a slight angle to the longitudinal axis of the fixed platform. Once the proper degree of tilting is determined, the relative positions of the two platforms are fixed by carefully tightening the clamping screws while maintaining the same degree of tilting. Adjustment of the focal position of the output beam of the laser is achieved by moving the assembled mount in a direction parallel to the longitudinal axis of the fixed platform. Means for retaining the assembled mount in a particular rotational orientation while the focal position is adjusted includes the fixed platform having a longitudinal groove formed therein for receiving tips of set screws threadedly engaged with the optical tube.

3 Claims, 3 Drawing Sheets

SPHERICAL BEARING OPTICAL MOUNT

BACKGROUND OF THE INVENTION

1. Field of the Invention

This invention relates to an optical mount, and more particularly, to an optical mount used for adjusting the direction of a laser beam generated by a laser diode module and used, within a sensor, for detecting particulate matter in a stream of air or water.

2. Prior Art

Many types of optical mounts have been designed which provide convenience in adjusting the position and/or orientation of various types of individual optical components or of entire optical systems. A wide variety of general purpose optical mounts for lenses, mirrors, lasers, fiber optics, and the like are commercially available. However, these generic mounts are typically useful only for laboratory "breadboard" or proof-of-concept experiments and, regardless of manufacturers' claims to the contrary, are usually not suitable for incorporation into actual deliverable hardware. Optical tracking systems for missiles and laser-based scanners for point-of-sale terminals, for example, almost always incorporate mounts that are unique to a particular set of optical and mechanical requirements.

Similarly, particle sensors based upon the use of laser technology fall into the category of electro-optical equipment which, in the prior art, has been mounted using hardware designed to meet a specific set of requirements. In such a particle sensor, an optical system is used to collect the light from a laser source and to re-direct the laser light, as a beam, into a small sensing volume which intersects a portion of the stream of particulate matter. Particle sensors having a detection system that measures the degree of light extinction utilize the fact that small particles which pass through the sensing volume scatter light away from the main beam, thus reducing the beam intensity. Alternately, a particle sensor can be based on a detection system which measures the extent of light scattering. In the latter sensor, high numerical aperture optics are used to collect the light scattered by the small particles which pass through the sensing volume. The scattered light pulses are brought to focus on a sensitive detector.

In the prior art, mounts for a laser and for a beam-forming optical assembly, or lens, in a particle sensor are considered to have separate functions and are separated physically. Typically, the laser is adjustable in position within a plane disposed generally perpendicularly to the direction of the laser beam. The beam-forming optics, on the other hand, are distributed along an axis disposed perpendicularly to said plane and can be moved only with respect to this axis. So moving the beam-forming optics allows the focal point of the laser beam to be adjusted.

To a first approximation, adjustments in the position of the laser produce the desired beam steering effect; and adjustments in the position of the beam-forming optics provide for variations in laser beam focus. In practice, however, one quickly discovers that, while these adjustments are individually easy to implement, they must be performed in succession and iteratively many times to overcome important higher order effects.

These higher order effects are caused by a complex interaction between the laser beam and the beam-forming optics. If the beam-forming optics have a large conjugate ratio, small changes in the position of the laser beam at the object plane can result in large changes in the position of the beam at the image plane inside the sensing volume. Moreover, shifts in the position of the laser in a direction generally perpendicularly to the original direction of the laser beam cause the distance between the laser and the beam-forming optics to change. As a result, the focal characteristics of the laser beam within the sensing volume are affected. In order to compensate for this effect, the position of the beam-forming optics must be adjusted to restore focus. This adjustment, in turn, has a small, but perhaps measurable, effect on the alignment of the laser beam within the sensing volume.

An additional complication arises when the laser beam is sufficiently far out of alignment with the optical axis of the beam-forming optics so as to affect the beam quality.

In general, the sensitivity and resolution of a laser-based particle sensor can be seriously degraded by slight misalignments in its optical system. Such misalignments can be caused by shock, vibration, and/or temperature changes. Preventing a shock or vibration-induced misalignment requires that certain components of the optical system, once positioned, be rigidly retained in place. At the same time, mounts employed to so retain these components must be robust in construction and adjustable with a high degree of sensitivity, at least at the outset, in order to achieve peak performance from the sensor.

It is well known to persons skilled in the prior art that the alignment procedures for laser-based particle sensors are iterative, difficult, and time-consuming. A typical alignment can take an operator an hour to accomplish.

SUMMARY

The primary object of this invention is to provide an optical mount which can be adjusted, with relative ease, both to align, with a target, a laser beam from a laser retained on the mount and to focus the beam on a narrowly-defined sensing volume within the target.

A further object of this invention is to provide such an optical mount which, when employed in a laser-based particle sensor or the like, allows the sensor to maintain its resolution even when the instrument in which the sensor is housed is subjected to levels of shock and vibration found in a typical industrial environment.

In accordance with the present invention, there is provided a device for mounting a laser light source, which comprises an assembly slideably received by an optical tube, the assembly having a fixed part, a mobile part, and a spherical bearing. The mobile part is adapted for receiving a single rigid module that includes a small, solid state laser diode light source and miniature laser diode collimating optics which have been pre-focused and pre-aligned, thereby eliminating cross-talk between adjustments of the focus and of the boresight, or alignment, of the laser output beam. Preferably, a commercially available, miniature pre-collimated laser diode module with built-in power supply is used.

The fixed and mobile parts of the slideable assembly each have an end defining a socket for receiving the spherical bearing. Opposing ends of the spherical bearing are juxtaposed with the fixed and mobile parts, respectively. In addition, the fixed and mobile parts each define at least three holes, the holes in the fixed and mobile parts being alignable. Means for both adjusting and retaining the positions of the fixed and mobile parts relative to each other comprises clamping screws which, in assembled relation, are slideably inserted into the holes of the fixed part, extend past the spherical bearing along its periphery, and are threadedly engaged by the holes of the mobile part.

With the mount according to the present invention, boresighting a laser beam, i.e., aligning a laser beam with the bore of a target, is accomplished by moving the mobile part relative to the fixed part. By varying the degree to which each of the clamping screws is tightened, one can effect a solid angle change in the relative positions of the mobile and fixed parts. Experiments with a prototype of the mount has shown that an optimum alignment of the laser beam can be made within a few minutes.

Once the laser beam has been boresighted, its focal position can be adjusted by moving the assembly, comprising the fixed and mobile parts, in a direction approximately parallel to the direction of the laser beam. The assembly is held in the same rotational orientation relative to the optical tube throughout the process of adjusting the focus. Means for so retaining the assembly comprises a pair of nylon-tipped set screws threadedly engageable with the optical tube; in addition, the fixed part defines a V-shaped groove for receiving the nylon-tipped end of each set screw, the groove being disposed parallel with the longitudinal axis of the fixed part. With the set screws initially adjusted to exert light pressure upon the walls of the V-shaped groove, the fixed part can be smoothly slide back and forth inside the optical tube, facilitating adjustment of the focus of the laser output beam while preserving beam boresight. When the proper focal position of the output beam of the laser module has been achieved, the set screws are tightened to prevent further movement of the fixed part relative to the optical tube.

DETAILED DESCRIPTION OF THE PREFERRED EMBODIMENT

Figure 1:
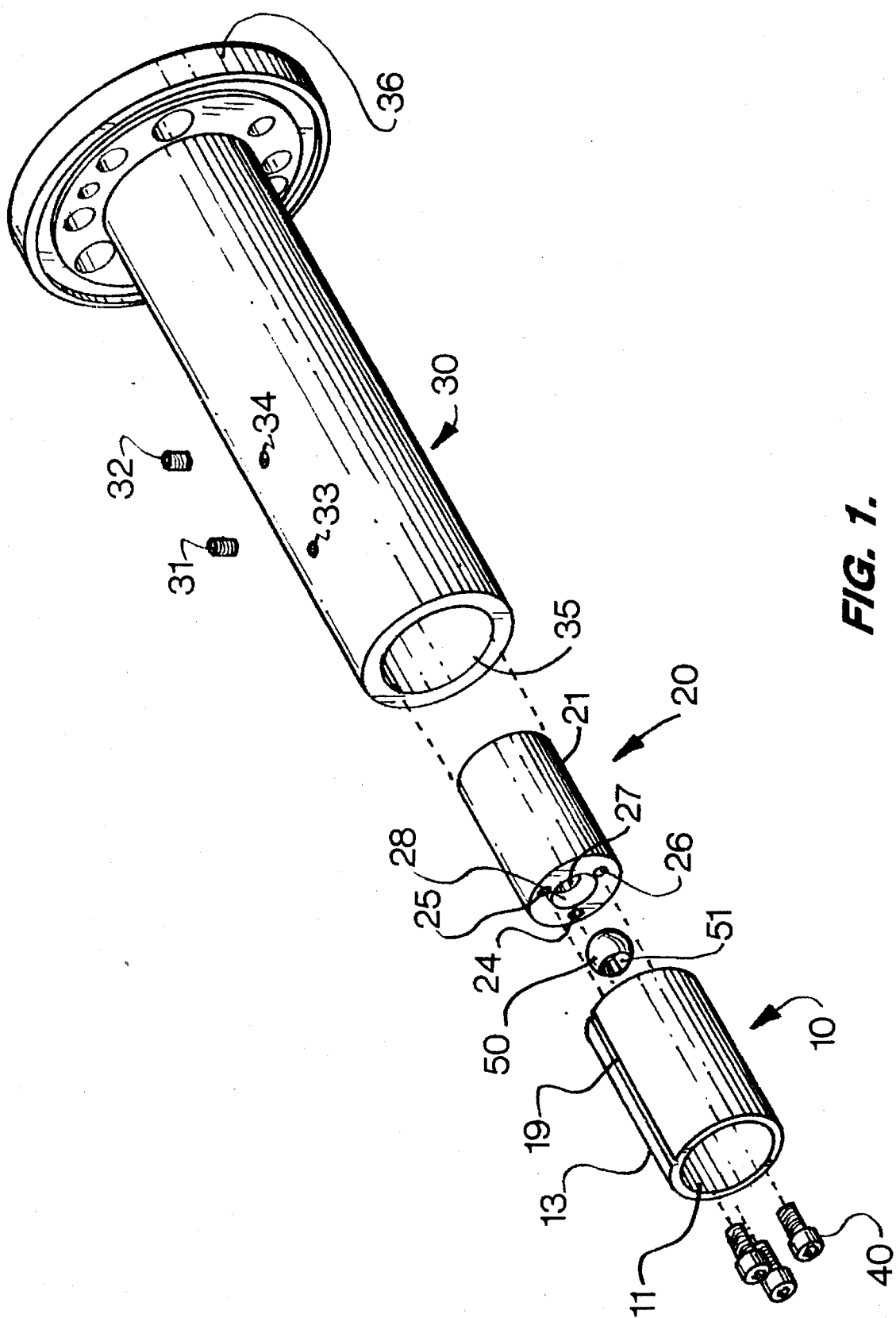
FIG. 1 is an exploded perspective view of the optical mount according to the present invention.

As illustrated in the drawings, a spherical bearing optical mount according to the present invention has fixed and mobile platforms such as parts 10 and 20, respectively, a spherical bearing 50, and an optical tube 30. Preferably, the fixed and mobile parts, the spherical bearing and the optical tube are all fabricated from an aluminum alloy known as Al 6061-T6 or its equivalent.

Figure 2:
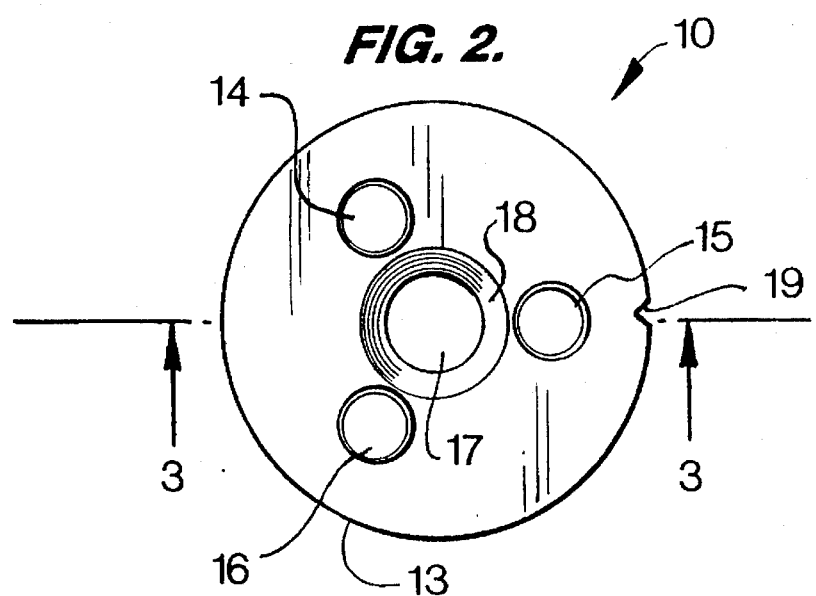
FIG. 2 is a top plan view, on an enlarged scale, of a fixed part of the optical mount according to FIG. 1.
Figure 3:
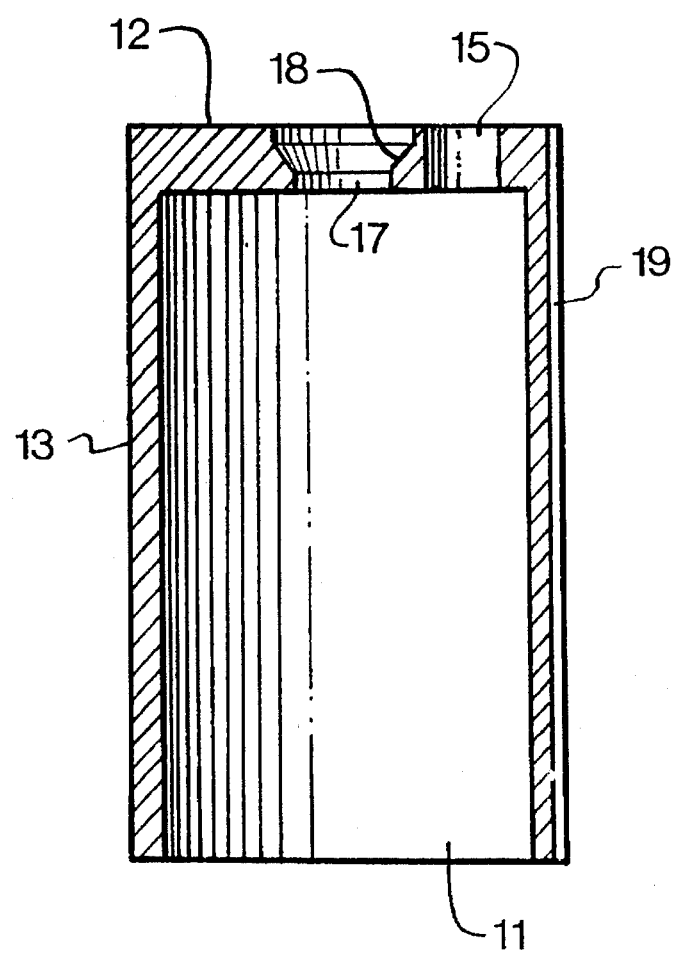
FIG. 3 is a cross-section, taken along line 3—3 of FIG. 2, of the fixed part.
Figure 4:
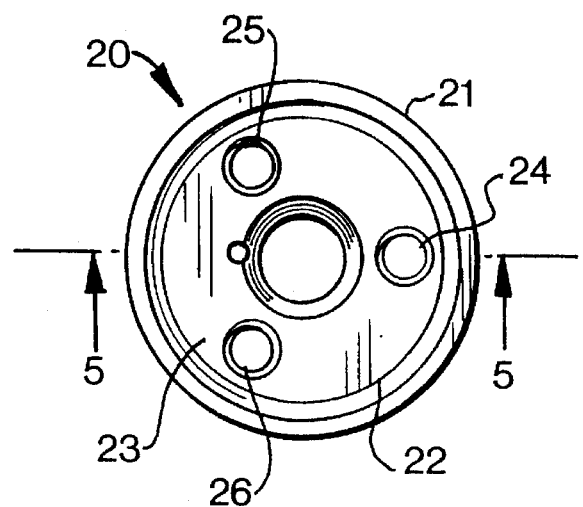
FIG. 4 is a top plan view, on an enlarged scale, of a mobile part of the optical mount according to FIG. 1.
Figure 6:
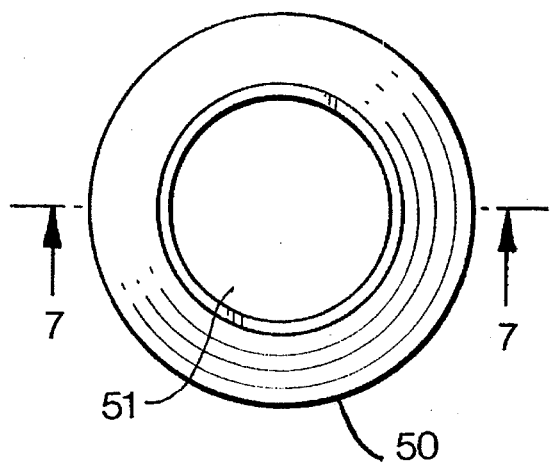
FIG. 6 is a top plan view, on an enlarged scale, of the spherical bearing in the optical mount according to FIG. 1.
Figure 5:
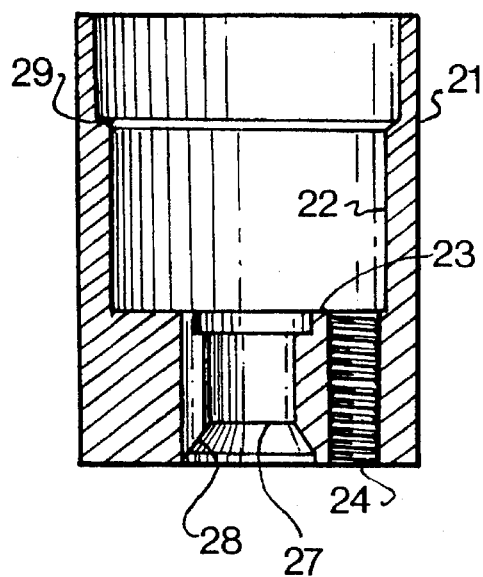
FIG. 5 is a cross-section, taken along line 5—5 of FIG. 1, of the mobile part.
Figure 7:
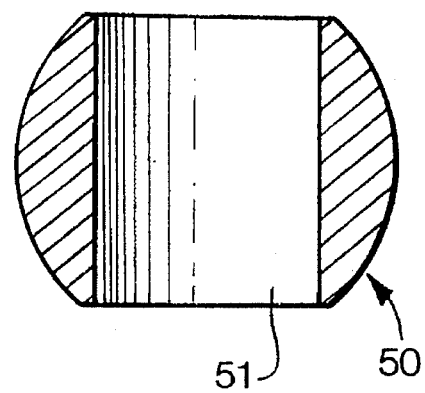
FIG. 7 is a cross-section, taken along line 7—7 of FIG. 6, of the spherical bearing.

The fixed part 10 comprises a hollow cylinder 13 having an open end 11 and a closed end 12, both ends being of generally circular outer periphery. The closed end 12 defines an opening 17 disposed in the center thereof and at least three clearance holes 14, 15, 16 for receiving clamping screws 40. Circular in shape and approximately equal in diameter, the holes 14, 15, 16 are centered along an imaginary concentric circle surrounding the opening 17, with centers of contiguous pairs of holes being spaced an uniform distance apart. As is illustrated in FIG. 2, the three holes 14, 15, 16 are disposed generally at the corners of an imaginary equilateral triangle. The closed end 12 further defines a chamfer 18 which bounds the opening 17. The curvature and size of the chamfer 18 is such that the spherical bearing 50 can be seated therein. In the preferred embodiment, the chamfer 18 has a depth which measures, by way of example, 0.105 inches and fabricated using a 0.250 inch diameter ball end mill.

The mobile part 20 comprises an open hollow cylinder having an exterior surface 21 terminating in a closed end 23. The closed end 23 defines a centrally-disposed opening 27 with a chamfer 28 and holes 24, 25, 26 for threadedly engaging the clamping screws 40. The holes 24, 25, 26 in the mobile part 20 are alignable with the holes 14, 15, 16 formed in the fixed part 10. Like the chamfer 18, the curvature and size of the chamfer 28 is such that the spherical bearing 50 can be seated therein.

In the preferred embodiment, the mobile part 20 also defines an open-ended chamber bounded by a wall 23 at one end and by a cylindrical interior surface 22 which extends from the wall to a shoulder 29. The chamber is employed to house certain components of a laser optics assembly (not shown). In use, a cylindrical lens holder (not shown) for the assembly is slideably received by the mobile part 20; when the holder is mounted therewithin, a portion of the holder abuts the shoulder 29, thereby facilitating aligning the lens (not shown).

As is best illustrated in FIG. 1, the spherical bearing 50 is sandwiched between the fixed part 10 and the mobile part 20. Similarly to the openings 17 and 27 of the fixed part 10 and mobile part 20, respectively, the spherical bearing 50 defines a through passageway 51. In the assembled mount according to the present invention, longitudinal axes of the through passageway 51 and of the openings 17, 27 are generally aligned with each other so that an electrical cable (not shown) can be feed through the openings and the passageway, thereby connecting the laser module electrically to an external power source (not shown).

Maintaining the fixed part 10, the bearing 50, and the mobile part 20 in their relative positions with respect to each other are the clamping screws 40. These screws extend through the holes 14, 15, 16 in the closed end 12 of the fixed part 10, alongside the spherical bearing 50, and into the holes 24, 25, 26 of the mobile part 20; there each of the clamp screws is threadedly engaged. When the fixed part 10, the bearing 50, and the mobile part 20 are held together under compression, a gap separates proximate edges of the fixed and mobile parts. The gap is sufficiently large to permit tilting of the longitudinal axis of the mobile part 20 by several degrees with respect to the longitudinal axis of the fixed part 10.

The procedure for aligning the laser optics assembly placed in the mobile part 20 is by a combination of loosening and of tightening the clamping screws 40 until the laser beam is properly -aligned with a target (not shown) in target holder 36. Field experience has shown that the beam can be aligned in a few minutes following this procedure.

The optical tube 30, which terminates in the target holder 36, defines a bore 35 for slideably receiving the fixed part 10 and mobile part 20 when the spherical bearing 50 is mounted between these two parts. In the preferred embodiment, the bore 35 measures, by way of example, 0.750 inches in diameter, whereas the fixed part 10 and the mobile part 20 have outer diameters of 0.747 inches and 0.650 inches, respectively; moreover, the overall length of the tube 30 is substantially longer than the combined lengths of the fixed and mobile parts which both measure approximately 1.250 inches in length. In general, clearance between the mobile part 20 and the walls of the bore 35 must be sufficient to allow the mobile part to be tilted relative to the fixed part 10. In the preferred embodiment, the longitudinal axis of the mobile part 20 can be disposed at an angle of up to 4 degrees from the longitudinal axis of the fixed part 10.

The optical mount further comprises means, including a groove 19 formed in the exterior surface of the hollow cylinder 13, for retaining the fixed part 10 in proper alignment with the optical tube 30. Also included in the retaining means are set screws 31, 32, which are threadedly engageable with holes 33, 34, respectively, formed in the optical tube 30. The set screws 31, 32 are of sufficient length that portions thereof can be disposed within the bore 35 when the set screws are threadedly engaged with the holes 33, 34.

In use, the mobile part 20, together with its internally-mounted laser optics assembly, the spherical bearing 50, and the fixed part 10 are slid, as a single assembled unit, into the bore 35 of the optical tube 30. The fixed part 10 is inserted into the optical tube 30 in such a way that portions of the set screws 31, 32 protrude into the groove 19. The set screws 31, 32 are then tightened just enough to hold the fixed part 10 in position for alignment.

By a combination of loosening and of tightening the clamping screws 40, one can bring a laser beam generated by a laser/laser optics assembly (not shown) secured within the mobile part 20 into proper alignment with a target (not shown) in the target holder 36. Preferably, the orientation of the mobile part 20 with respect to the fixed part is adjusted to get a maximum signal output from the sensor. Maximum signal output typically occurs when the longitudinal axes of the fixed part 10 and of the mobile part 20 are about 1 degree out of alignment rather than being more closely aligned. Otherwise, interference caused by the laser beam being reflected back onto the laser diode reduces the signal output.

Next the focus of the laser output beam is adjusted by sliding the fixed part 10, together with the mobile part 20 and spherical bearing 50 as an assembled unit, along the groove 19. Once both the laser beam focus and the alignment of the beam with the target is satisfactory, a final tightening of the set screws 31, 32 and of the clamping screws 40 is performed, making the optical mount stable and shock resistant. With a little experience, one can complete the entire procedure in a few minutes.

In an alternate embodiment, the spherical bearing 50 and mobile part 20 are nested within a modification of the fixed part 10. The modified fixed part is similar to the fixed part 20 but has a substantially greater internal diameter than the fixed part 20 and defines a chamfer which is disposed internally, rather than externally, for receiving one end of the spherical bearing. When the modified fixed part, the spherical bearing 50 and the mobile part 20 are held in assembled relation by the clamping screws 40, an open end of the modified fixed part faces in the direction of the laser beam output. This alternate embodiment, which exhibits the same high degree of boresight stability as does the preferred embodiment, is particularly useful in situations in which the length of the optical tube must be kept as short as possible.

It is understood that those skilled in the art may conceive other applications, modifications and/or changes in the invention described above. Any such applications, modifications or changes which fall within the purview of the description are intended to be illustrative and not intended to be limitative. The scope of the invention is limited only by the scope of the claims appended hereto.

It is claimed:

1. A device for mounting, as a single rigid module, a laser diode light source and collimating optics therefor, which comprises:

(a) an optical tube having a longitudinal axis; and (b) an assembly having a fixed part, a mobile part, and a spherical bearing; the mobile part being adapted to receive the rigid module, the fixed part being slideably received by the optical tube; the fixed and mobile parts each having an end defining a socket for receiving the spherical bearing, the spherical bearing being juxtaposed with the fixed and mobile parts; the fixed and mobile parts each defining at least three holes, the holes in the fixed and mobile parts being alignable;

(c) means for positioning the fixed and mobile parts relative to each other, the positioning means comprising clamping screws, each clamping screw being slideably inserted into one of the holes of the fixed part, extending past the spherical bearing along its periphery, and being threadedly engaged by one of the holes of the mobile part; and (d) means for maintaining the assembly in a particular rotational orientation with respect to the optical tube as the fixed part is slid back and forth along the longitudinal axis of the optical tube.

2. A device for mounting, as a single rigid module, a laser diode light source and collimating optics therefor, which comprises:

(a) an assembly having a fixed part, a mobile part, and a spherical bearing; the mobile part being adapted to receive the rigid module, the fixed part having a longitudinal axis; the fixed and mobile parts each having an end defining a socket for receiving the spherical bearing, the spherical bearing being juxtaposed with the fixed and mobile parts; the fixed and mobile parts each defining at least three holes, the holes in the fixed and mobile parts being alignable;

(b) means for positioning the fixed and mobile parts relative to each other, the positioning means comprising clamping screws, each clamping screw being slideably inserted into one of the holes of the fixed part, extending past the spherical bearing along its periphery, and being threadedly engaged by one of the holes of the mobile part; and (c) means for holding the fixed part which limits travel thereof to movement back and forth along its longitudinal axis without any rotation of the fixed part about said axis.

3. A device for mounting, as a single rigid module, a laser diode light source and collimating optics therefor, which comprises:

(a) an assembly having a fixed part, a mobile part, and a spherical bearing; the mobile part being adapted to receive the rigid module; the fixed and mobile parts each having a longitudinal axis and an end defining a socket for receiving the spherical bearing, the spherical bearing being juxtaposed between the fixed and mobile parts;

(b) means for clamping the spherical bearing in place within the sockets of the fixed and mobile parts, proximate edges of the fixed and mobile parts being spaced apart from each other when the spherical bearing is so clamped, so that the longitudinal axes of the fixed and mobile parts can be disposed at an angle to each other; and (c) means for holding the fixed part which limits travel thereof to movement back and forth along its longitudinal axis without any rotation of the fixed part about the longitudinal axis of the fixed part.

* * * * *